United States Patent [19]

Stewart

[11] 4,434,381
[45] Feb. 28, 1984

[54] SENSE AMPLIFIERS

[75] Inventor: Roger G. Stewart, Neshanic Station, N.J.

[73] Assignee: RCA Corporation, New York, N.Y.

[21] Appl. No.: 328,437

[22] Filed: Dec. 7, 1981

[51] Int. Cl.³ .................... H03K 5/153; H03K 3/356; G11C 7/06
[52] U.S. Cl. ................................... 307/530; 307/279; 365/208
[58] Field of Search ............... 307/279, 350, 530, 354; 365/189, 191, 195, 196, 203, 207, 208

[56] References Cited

U.S. PATENT DOCUMENTS

| | | | |
|---|---|---|---|
| 3,828,204 | 8/1974 | Farnsworth | 307/235 R |
| 3,849,673 | 11/1974 | Koo | 307/279 X |
| 3,868,656 | 2/1975 | Stein et al. | 307/276 X |
| 3,882,326 | 5/1975 | Kruggel | 307/304 X |
| 3,989,955 | 11/1976 | Suzuki | 307/279 X |
| 4,011,465 | 3/1977 | Alvarez, Jr. | 307/279 X |
| 4,050,030 | 9/1977 | Russell | 330/23 |
| 4,096,401 | 6/1978 | Hollingsworth | 307/279 X |
| 4,107,556 | 8/1978 | Stewart et al. | 307/279 X |
| 4,114,055 | 9/1978 | Hollingsworth | 307/279 X |
| 4,150,311 | 4/1979 | Matsuda et al. | 307/279 X |
| 4,216,390 | 8/1980 | Stewart | 307/279 X |
| 4,239,994 | 12/1980 | Stewart | 307/279 X |

Primary Examiner—Larry N. Anagnos
Assistant Examiner—David R. Bertelson
Attorney, Agent, or Firm—Joseph S. Tripoli; Henry I. Schanzer

[57] ABSTRACT

A sense amplifier having a transition point defining the signal level at its input above which it senses one binary condition and below which it senses the other binary condition includes precharge means for offsetting the voltage at its input a small amount ($\Delta V$) in a particular sense (which may be plus or minus) from its transition point. The amplifier also includes controllable impedance means connected to its output for adjusting its output at the termination of a precharge period to a voltage level which causes the amplifier to respond in a relatively symmetrical manner to input signals of either binary condition.

9 Claims, 5 Drawing Figures

SENSE AMPLIFIERS

This invention relates to sense amplifiers which are especially suitable for sensing information stored in memory cells.

In the accompany drawing like reference characters denote like components, and

Figure 1:
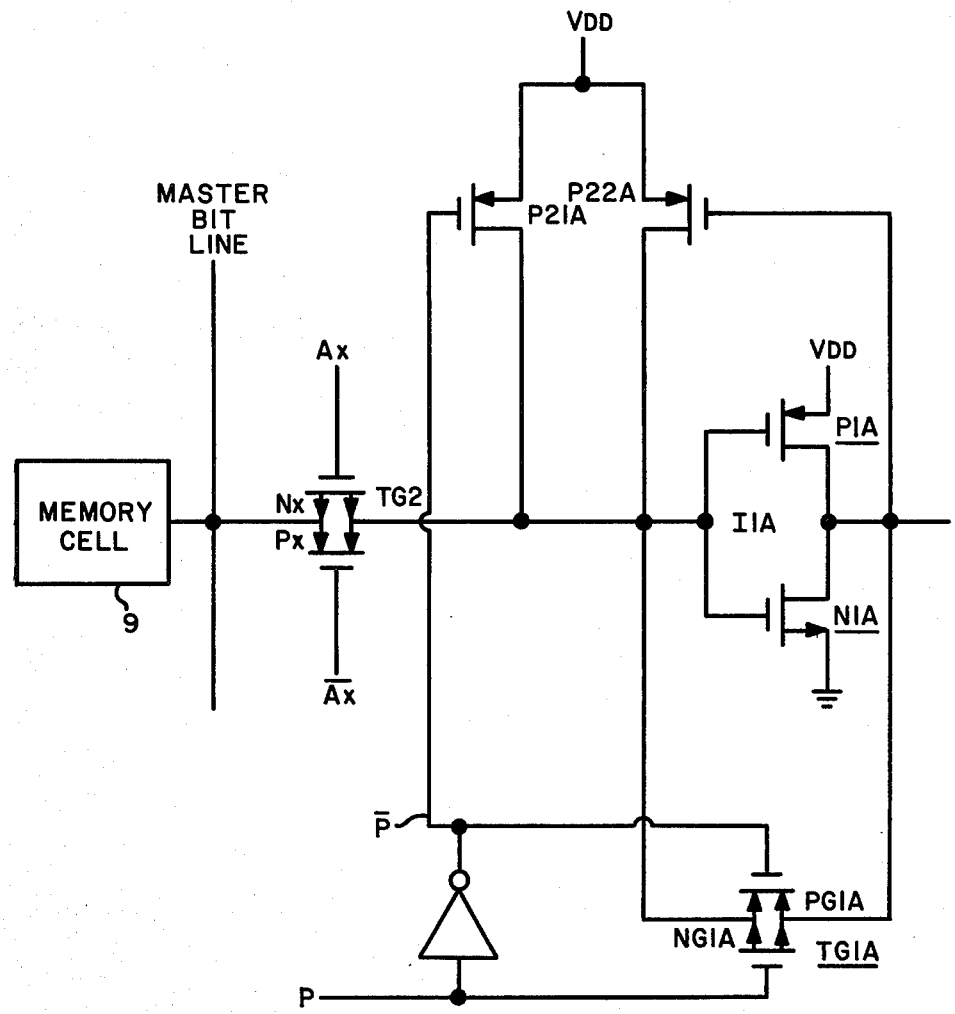
FIG. 1 is a schematic diagram of a prior art circuit.

Some memory cells and memory systems are characterized in that for one binary condition they provide a "well" defined current or voltage while for the other binary condition they provide an "ill" defined current or voltage. By way of example, assume that the memory cell 9 of FIG. 1 can sink (draw to ground) substantial current (has a well defined "0") but cannot source (supply) much, if any, current (has a poorly defined "1"). This characteristic makes is difficult to "read" or "sense" the "ill" defined binary condition. A sense amplifier designed to overcome this problem is discussed in U.S. Pat. No. 4,239,994, whose teachings are incorporated herein by reference and a simplified version of which is redrawn as FIG. 1. The sense amplifier of FIG. 1 includes an inverter, I1A, having a transition point ($V_{TR}$) which defines the level above which it senses signals representing one binary condition and below which it senses signals representing the other binary condition. During a precharge period, prior to sensing the contents of the memory cell, a transmission gate TG1A is turned-on providing a negative feedback path between the input and the output of I1A. In the absence of any other signal or bias source connected to the input of I1A, the turn-on of TG1A causes the input and output of I1A to be biased to $V_{TR}$. A high impedance transistor P21A controlled by the same precharge pulse that turns-on TG1A is connected between $V_{DD}$ and the inverter input to cause the inverter input to be offset by a small amount (e.g. a few millivolts) to that side of the transition point (in this instance slightly above $V_{TR}$) indicative of the presence of the ill defined (binary "1") condition. Correspondingly in this instance, the inverter output is offset by a somewhat greater amount (below $V_{TR}$) due to the gain of the amplifier. [An extremely high impedance transistor P22A is also connected in circuit to provide some positive feedback but it can be ignored for the rest of this discussion.] When sensing occurs, if the binary "1" condition stored in the memory cell is coupled to the inverter input, its output is already established to indicate that binary condition; if the binary "0" condition stored in the memory cell is coupled to the inverter the sense amplifier output is quickly driven to indicate the presence of the "0" condition since the offset bias is small. Hence, the amplifier output responds very quickly to the different values of input signal.

However, a problem exists in that when the precharge ends, there occurs a small but abrupt shift in the voltage level at the output of inverter I1A. The shift is due to the turn-off of TG1A which suddenly removes the loading on the inverter and causes an increase in its open loop gain. Where the input offset bias is positive, the inverter output shifts down at the termination of precharge some amount in addition to the output offset established during precharge. This shift reduces the benefits gained from the negative feedback which had placed the input and the output of the inverter at levels which rendered the inverter very sensitive and which enabled its output to respond quickly and accurately to different values of input signals. The amplitude of the shift can be reduced by reducing the input offset bias level. But, the bias cannot be reduced below some minimum level without sacrificing the safety margin established for reading the ill (e.g. logic "1") defined state. Thus, in a typical application the shift adds approximately 20 nanoseconds to the access time and results in a sense amplifier which is imbalanced in that it responds faster to the ill defined state than to the well defined state.

A sense amplifier embodying the invention includes means for controlling the setting of its transition point during a precharge period and means for adjusting the output level of the sense amplifier at the termination of the precharge period. A sense amplifier embodying the invention may also include bias means responsive to the initiation of a precharge period but independent of the termination of the precharge period for increasing the offset at the input of the sense amplifier for a predetermined biasing period following the termination of the precharge period.

In the discussion to follow, insulated-gate field-effect transistors (IGFETs) are used to illustrate the invention. IGFETs of P conductivity are denoted by the letter P followed by a particular reference character and IGFETs of N conductivity are denoted by the letter N followed by a particular reference character.

Figure 2:
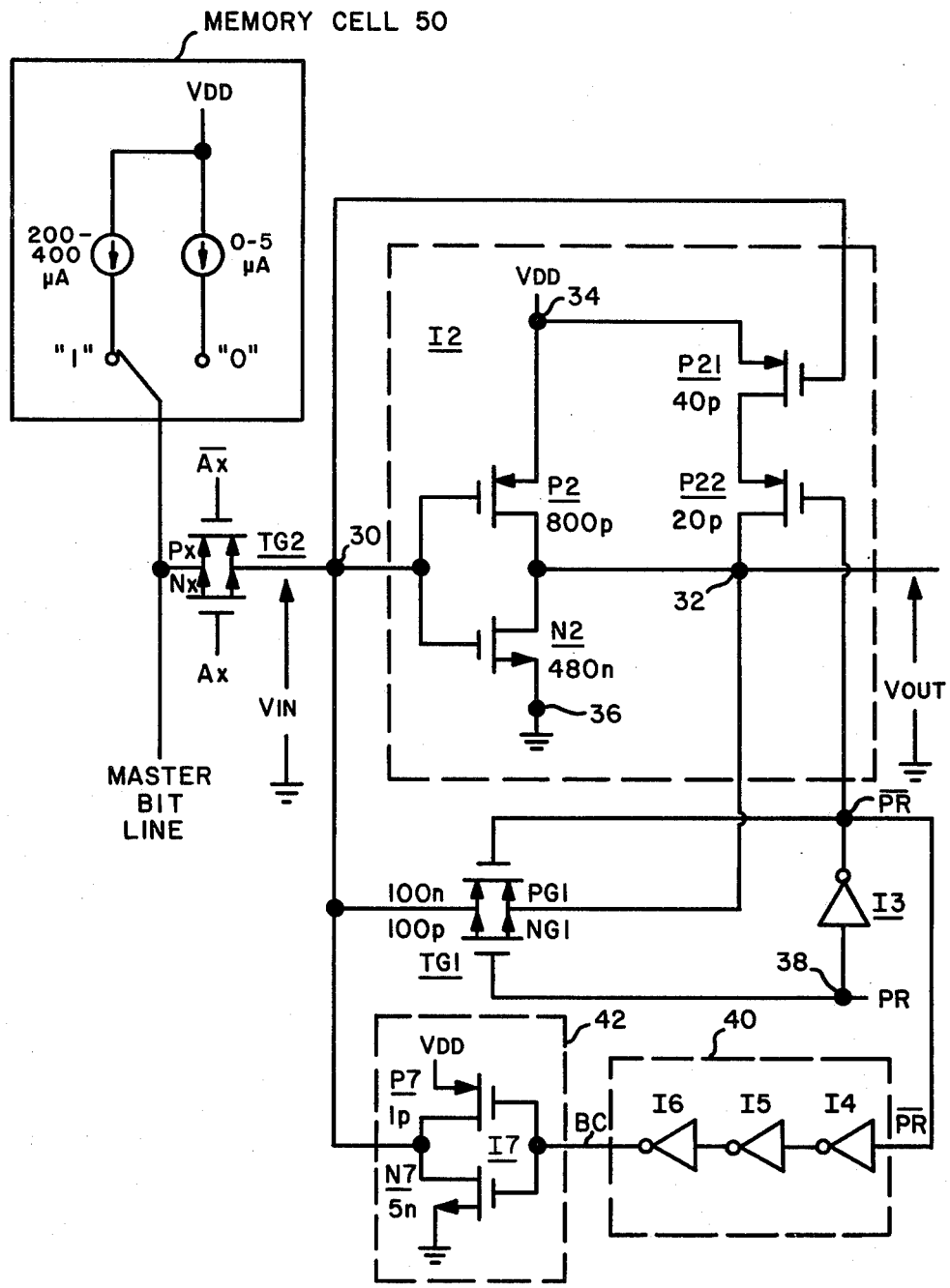
FIG. 2 is a schematic diagram of a circuit embodying the invention.
Figure 4:
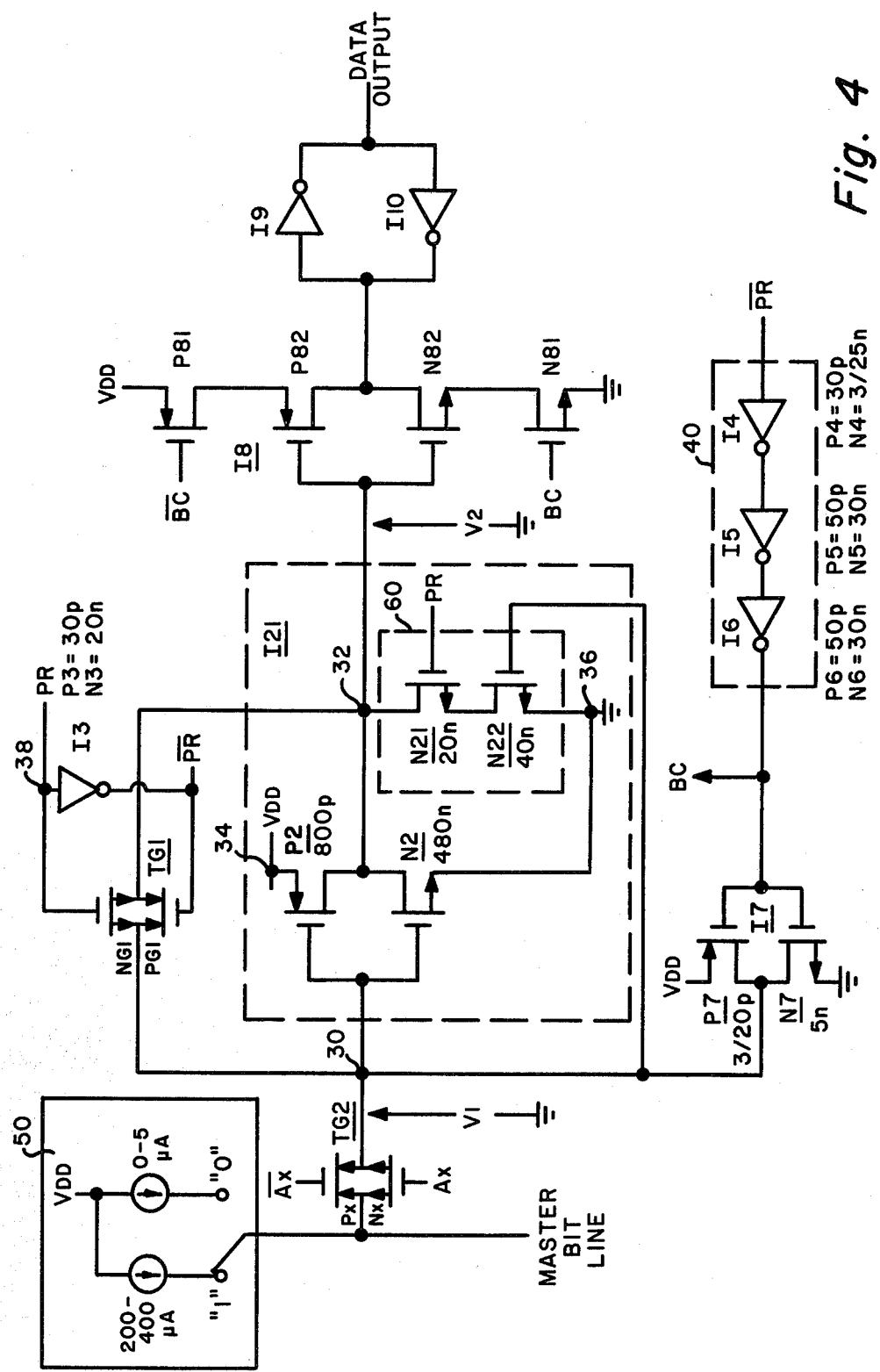
FIG. 4 is a schematic diagram of another circuit embodying the invention.

In the circuits of FIGS. 2 and 4 to follow various numbers are shown adjacent to some of the transistors and inverters. The IGFETs of N-conductivity type have a numerical number followed by the letter "n", the IGFETs of P-conductivity type have a number followed by the letter "p". The larger the number, the larger the size of the transistor and the higher its conductivity. The letter "n" indicates a unit of size and hence of conductivity for the N-IGFETs and the letter "p" indicates a unit of size and hence of conductivity for the P-IGFETs. An N-IGFET of like size as a P-IGFET has approximately twice the conductivity under like bias condition.

Referring to FIG. 2, the sense amplifier includes an inverter I2 comprised of IGFETs P2, P21, P22 and N2. The gate electrodes of P2 and N2 are connected to the inverter signal input terminal 30, their drain electrodes are connected to the inverter signal output terminal 32 and their source electrodes are connected to the inverter power terminals, 34 and 36, respectively to which are applied $+V_{DD}$ and ground, respectively. The source of P21 is connected to terminal 34, its drain is connected to the source of P22, and the drain of P22 is connected to terminal 32 whereby the branch comprised of the series connected conduction paths of P21 and P22 is connected in parallel with P2. The gate electrode of P21 is connected to input terminal 30 while the gate electrode of P22 is driven by a Precharge (PR) signal.

A complementary transistor transmission gate TG1, comprised of complementary IGFETs PG1 and NG1 having their source-drain paths connected in parallel, is provided for selectively completing a negative feedback connection from the output 32 of inverter I2 to its input 30 and thereby biasing I2 in its linear region where it has its highest gain. A precharge signal (PR) applied to a control terminal 38 controls the turn-on and turn-off of TG1 and P22. The PR signal is applied to the gate electrode of NG1 and to the input of an inverter I3 whose output is connected to the gate electrode of PG1. $\overline{PR}$, the complement of PR, is produced at the output of I3 which is connected to the gate electrode of P22. PR is normally "low" (i.e. at + zero volt) causing transmission gate TG1 to be non-conductive by reason of the gate electrodes of NG1 and PG1 being respectively "low" and "high", which causes them to present very high impedances between their respective source and drain electrodes. During selected precharge intervals, "high" precharge pulses are applied to terminal 38, driving the gate electrode of NG1 "high" and the gate electrode of PG1 "low", which causes PG1 and NG1 to be conductive whereby TG1 provides a relatively low impedance, $Z_{T1}$, between the output 32 and input 30 of inverter I2.

A pulse stretching network 40 and a bias source 42 comprised of an inverter I7 are also provided to control the bias applied to inverter I2. Network 40 includes inverters I4, I5, and I6 cascaded with inverter I3 to produce a positive going ("high") bias control (BC) pulse of, for example, 75 nanoseconds duration each time a precharge pulse occurs. Inverters I4, I5 and I6 may be complementary inverters (as shown for I7) where at least one of the inverters is highly skewed to stretch the duration of a positive going pulse. Network 40 may be replaced by any suitable monostable multivibrator or like timing circuit. The BC pulse is applied to the input of inverter I7 whose output is connected to input terminal 30 of I2. I7 is comprised of complementary IGFETs P7 and N7 with the conduction path of P7 being connected between $V_{DD}$ and terminal 30 and the conduction path of N7 being connected between terminal 30 and ground. The gate electrodes of P7 and N7 are at the input of I7 while their drains are connected to terminal 30. P7 is a very small device which when fully-on can source, for example, a current in the range of 10 microamperes, while N7 is a moderately small device which when fully-on can sink a current from node 30 to ground which, for example, may be in the range of 100 microamperes.

The sense amplifier is selectively coupled via a transmission gate TG2 controlled by word line signals $\overline{A_X}$ and $A_X$ to a master bit line (MBL) onto which is applied the output of memory cell 50 whose logic "one" output is an equivalent source of current in the range of 200 to 400 microamperes, and whose logic "zero" output is an equivalent source of current in the range of 0 to 5 microamperes. When $A_X$ is low, TG2 is off (provides a very high impedance) and when $A_X$ is high, TG2 is on and the memory cell and the master bit line (MBL) are coupled via a relatively low impedance path to input terminal 30.

Figure 3:
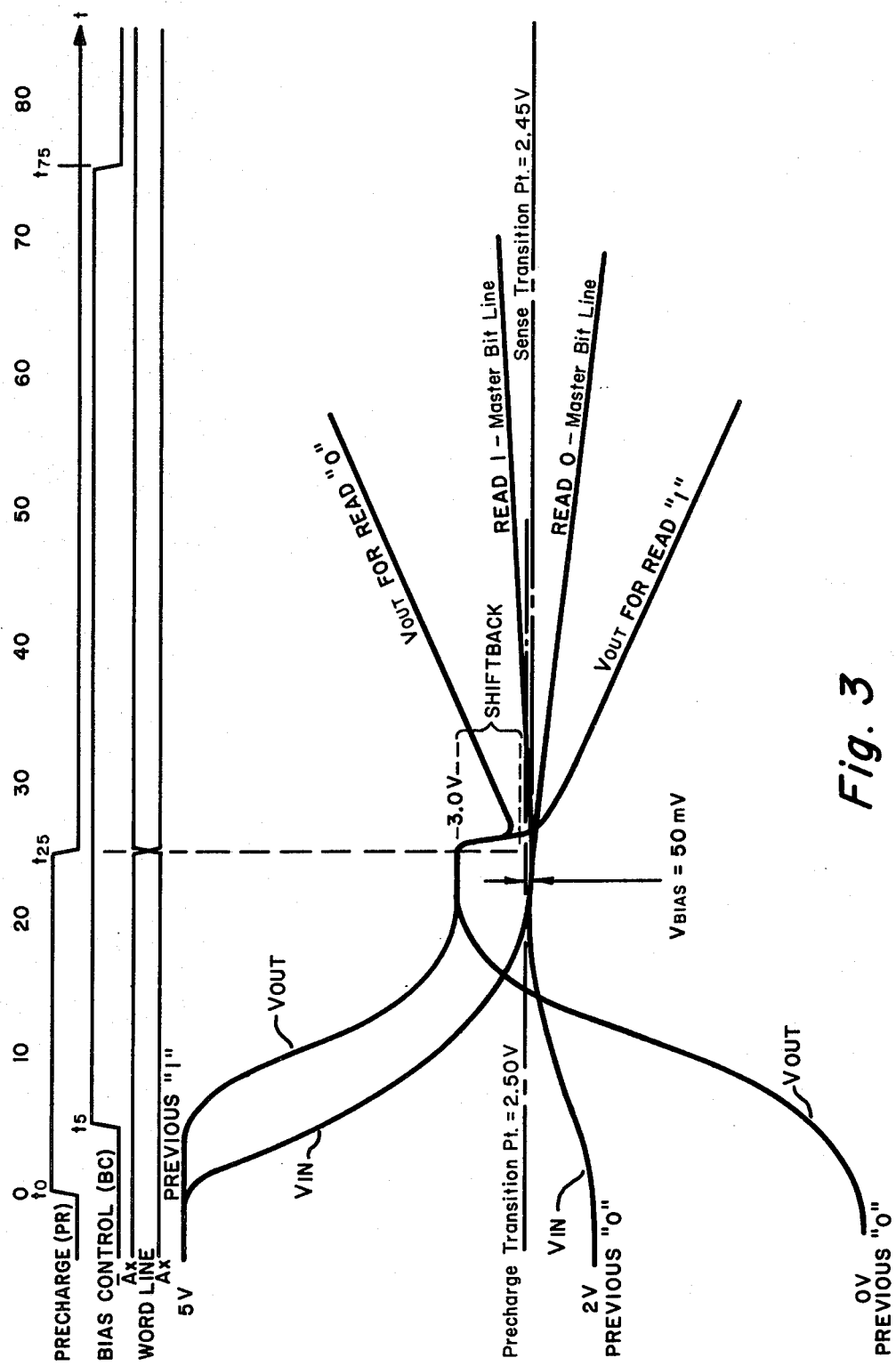
FIG. 3 is a diagram of waveforms associated with the circuit of FIG. 2.

The operation of the circuit of FIG. 2 is best explained with reference to FIG. 3. At time $t_0$ a positive precharge pulse (PR) is applied to terminal 38 causing PG1 and NG1 of TG1 to turn-on and an impedance defined as $Z_{T1}$ is formed between the output 32 and the input 30 of inverter I2. Concurrently, transistor P22 is switched-on hard since its gate electrode is driven by $\overline{PR}$ which goes "low" when PR goes "high". P22 functions as a switch and its effective impedance $Z_{P22}$ is very low compared to the effective impedance ($Z_{P21}$) of P21.

Hence, P22 has little if any effect on limiting the conduction of the branch comprised of P21 and P22. P21 whose gate electrode is connected to input terminal 30 is turned-on in a controlled fashion since its gate electrode is at $V_{IN}$ which, as detailed below, is driven to a level approximately equal to $V_{DD}/2$ while its source is at $V_{DD}$. When P21 and P2 are turned-on, P21 has an effective impedance ($Z_{P21}$) which is normally high relative to the effective impedance ($Z_{P2}$) of P2. However, in some instances, P21 and P2 could have similar impedances. In the circuit of FIG. 2, $Z_{P21}$ is approximately twenty times greater than $Z_{P2}$, while $Z_{P2}$ is approximately (but not exactly) equal to the effective impedance ($Z_{N2}$) of N2 under like bias conditions. For ease of discussion it is assumed that during precharge the effective impedance $Z_A$ between terminals 32 and 34 is equal to the effective impedance ($Z_B$) between terminals 32 and 36.

For the condition of TG1 being ON and $Z_A = Z_B$ for like bias condition and assuming TG2 to be off and inverter I7 disconnected from node 30, $V_{IN}$ and $V_{OUT}$ tend to go to $V_{DD}/2$ (i.e. the $V_{TR}$ of I2 is then $V_{DD}/2$). As shown in FIG. 3, whether $V_{IN}$ or $V_{OUT}$ were at a "high" or a "low" level prior to precharge, the precharge pulse causes $V_{IN}$ and $V_{OUT}$ to go towards $V_{DD}/2$. The effect of P7 from time $t_0$ until time $t_5$ when P7 is turned-off may be ignored since P7 is an extremely small, extremely high impedance device. At time $t_5$ (5 nanoseconds after the occurence of the PR pulse), the bias control (BC) signal applied to I7 goes "high", turning-on N7 and turning-off P7. The turn-on of N7 provides a conduction path having an effective impedance ($Z_{N7}$) between input 30 and ground. Although N7 functions as an impedance it could be replaced by a constant current source.

The turn-on of N7 causes the voltage level at input terminal 30 to decrease below $V_{TR}$ and the voltage level at the output 32 of I2 to increase above $V_{TR}$ as detailed below:

For the extremely high input impedance inverter I2, the current through $Z_{T1}$ is equal to the current through $Z_{N7}$. Therefore:

$$\frac{V_1}{Z_{N7}} = \frac{V_2 - V_1}{Z_{T1}} \quad \text{(eq. 1)}$$

where $V_1$ and $V_2$ are equal to $V_{IN}$ and $V_{OUT}$ respectively.

$$\Delta V_2 = -A \Delta V_1 \quad \text{(eq. 2)}$$

For $V_1$ and $V_2$ initially equal to the transistion point voltage $V_{TR}$:

$$\Delta V_2 = V_2 - V_{TR}; \text{ and } \Delta V_1 = V_{TR} - V_1 \quad \text{(eq. 3)}$$

By substituting equation 3 into equation 2 and solving for $\Delta V_1$ it may be shown that:

$$\Delta V_1 = \frac{V_{TR}[Z_{T1}]}{Z_{T1} + (A+1)Z_{N7}} \quad \text{(eq. 4)}$$

which yields:

$$V_1 = V_{TR} - V_{TR}(Z_{T1})/[Z_{T1} + (A+1)Z_{N7}] \quad \text{(eq. 5)}$$

From equation 5 it may be observed that $V_{IN}(=V_1)$ is offset with respect to $V_{TR}$ by an amount ($\Delta V_1$) equal to [$V_{TR}$] times $\{Z_{T1}/[(Z_{N7})(A+1)+Z_{T1}]\}$. For $V_{TR}=V_{DD}/2$, $V_{DD}=5$ volts, $A=10$ and $Z_{N7}=5Z_{T1}$, the offset ($\Delta V_1$) by which $V_{IN}$ is set below $V_{TR}$ during precharge may be calculated to be approximately 0.05 volt, and the offset ($\Delta V_2$) by which $V_{OUT}$ is above $V_2$ is approximately 0.5 volts.

$V_{IN}$ is clearly below the assumed $V_{TR}$ of $V_{DD}/2$, but by a very small amount $\Delta V_1$. The smallness of the $\Delta V_1$ is attributable to I2 operating in the linear portion of its characteristic wherein its voltage gain is high. That the offset $\Delta V_1$ is small is highly significant. The offset $\Delta V_1$, although small, is sufficient to indicate the presence of a "low" at node 30. But $\Delta V_1$ is so small that node 30 can be quickly driven (charged) positive with respect to $V_{TR}$ by an input signal source and $V_{OUT}$ is in turn driven negative, also with respect to $V_{TR}$.

The input bias offset, $\Delta V_1$, at the input of I2 is amplified by I2 which is biased in its linear region. Since $V_{IN}$ is offset from $V_{TR}$ by only a small $\Delta V_1$, the open loop voltage gain of I2 may be assumed to be relatively constant while TG1 is enabled. Continuing the example above, in response to a $\Delta V_1$ of $-0.05$ volt, the change $\Delta V_2$ in $V_2$ will be approximately $+0.50$ volt for an open loop gain of 10. Thus during precharge, for $V_{DD}$ equal to 5 volts, $V_{IN}$ is set to approximately 2.45 volts and $V_{OUT}$ is set to approximately 3.0 volts as shown in FIG. 3.

At the end of precharge, at time $t_{25}$, PR goes to zero and $\overline{PR}$ goes high turning-off TG1 and P22. The turn-off of TG1 removes the negative feedback across I2, with I2 being placed in a very sensitive high gain region. The turn-off of P22 causes the output of I2 to be shifted back towards a desired output level (e.g. $V_{DD}/2$), as shown in FIG. 3, without disturbing or affecting the level at the input of the inverter I2. The output is thus adjusted (i.e. it is driven in a direction to oppose the effect of the input bias on the output) to compensate for the effect of the input bias. The turn-off of P22 effectively disconnects the path comprised of P21 in series with P22 which earlier had been connected in parallel with P2. Removing P21 and P22 causes the impedance ($Z_A$) between terminals 32 and 34 to increase. Increasing $Z_A$ relative to $Z_{N2}$ causes $V_{OUT}$ to drop. Since $Z_{P21}$ and $Z_{P22}$ are significantly greater than $Z_A$ their removal from the circuit has a limited but predetermined effect on the value of $V_{OUT}$. As shown in FIG. 3, $V_{OUT}$ drops from 3 volts to a value close to 2.5 volts very shortly (within a few nanoseconds) after the precharge pulse terminates. It is significant that the output level has been "adjusted" (i.e., the output offset has been substantially decreased, without any effect on the offset bias level at the inverter input).

At the termination of precharge, the BC pulse remains high. Hence, the bias applied via N7 to the input of inverter I2 is then independent of the terminated precharge pulse. For ease of illustration assume that with a BC pulse of 5 volts applied to its gate electrode, N7 functions as a current source "sinking" a current of approximately 100 microamperes from node 30 to ground.

At the end of precharge, (at time $t_{25}$) the word line $A_X$ goes positive and $\overline{A_X}$ goes negative turning-on TG2 and coupling the memory cell to input node 30. If the output of the memory cell is at a logic "0" condition, little, if any, current is supplied from the cell to node 30. N7 which is biased to "sink" approximately 100 microamps of current causes node 30 to continue dropping causing $Z_{P2}$ to decrease and $Z_{N2}$ to increase whereby $V_{OUT}$ continues to rise relatively quickly towards $V_{DD}$, as shown in FIG. 3. If the memory cell output is a "1", a minimum current of 200 microamps is being sourced into node 30. Since N7 is biased to sink only 100 microamps, the voltage at node 30 begins to rise causing $Z_{P2}$ to increase and $Z_{N2}$ to decrease, which causes $V_{OUT}$ to drop relatively quickly, again as shown in FIG. 3. As shown in FIG. 3, within 5 to 10 nanoseconds of the end of precharge, $V_{OUT}$ is very well defined, being either close to 3 volts for the read-out of a "1" or 2 volts for the read-out of a "0". Thus the contents of the memory cell can be quickly and correctly ascertained. Maintaining the BC pulse for an extended period of time after the end of precharge enables the bias or offset voltage to start out small and to gradually increase unless opposed by the memory cell. This avoids the need for a relatively large initial offset bias and the corresponding loss of speed due to a relatively large initial offset which must be overcome. Hence in the circuit of FIG. 2 the access time is decreased. Also increasing the bias or offset as a function of time increases the safety margin whereby sources of error such as electrical noise, process defects, aging, transistor mismatch now only cause a relatively uniform and well behaved degradation of access time rather than the precipitous loss present in the prior art when an error voltage exceeds the fixed bias offset.

Figure 5:
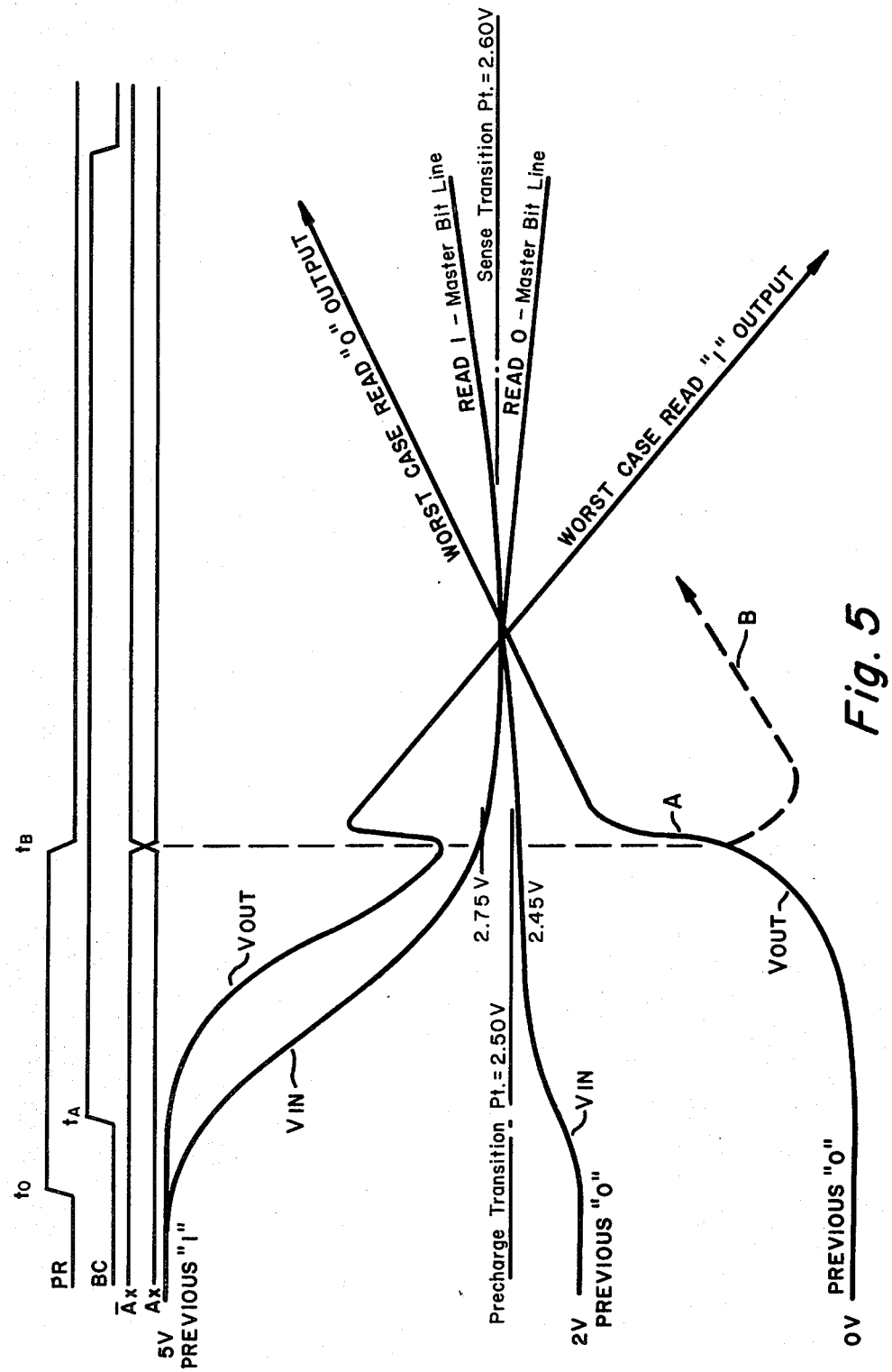
FIG. 5 is a diagram of waveforms associated with the circuit of FIG. 3.

Following the termination of the BC pulse at time $t_{75}$, the circuit reverts to a quiescent mode where data can be left to settle out on the bit line.

Where the primary concern is to have the sense amplifier produce, under worst case conditions, an output indicative of a poorly defined condition (e.g. "0") as quickly as it produces an output indicative of a well defined condition (e.g. "1") the circuit of FIG. 2 could be modified as shown in FIG. 4. Worst case conditions include, for example, a slow precharge condition or an extremely short precharge period which prevents the input and output of the inverter from reaching the desired steady state values (e.g. $V_{TR}$) at the termination of precharge. Thus, the circuit of FIG. 4 includes means for adjusting the amplifier output about a selected transition point, (e.g. $V_{TR}$) the object of the design being to center the transition point of the amplifier midway between the two worst case conditions which could be present on the bit lines at the time the precharge is terminated. The $V_{OUT}$ for two worst case conditions is illustrated in FIG. 5.

Referring now to FIG. 4, inverter I21 includes transistors P2 and N2 which are interconnected as in FIG. 2. I21 also includes a controllable branch 60 connected in parallel with transistor N2 (rather than in parallel with P2) between output terminal 32 and ground return 36. Branch 61 is comprised of transistors N21 and N22 having their conduction paths connected in series. The memory cell 50, the gating means TG2 coupling the memory cell to the amplifier input 30, the pulse stretching network 40, biasing inverter I7 and the transmission gate TG1 providing negative feedback between terminals 30 and 32 during precharge (PR) are all similar to the devices and interconnection of FIG. 2. The output ($V_2$) of I21 is applied to the input of pulsed inverter I8 which is enabled when BC is high. The output of I8 is applied to the input of a flip-flop comprised of two cross-coupled inverters I9 and I10.

During precharge, the operation of the circuit is similar to that of FIG. 2. However, as shown in FIG. 5 for waveform A, due to the precharge being slow (or the memory cell data being applied before a steady state is reached) the sense amplifier output ($V_{OUT}$) may be significantly below $V_{TR}$ at the end of precharge. If the shift circuit of FIG. 2 were employed $V_{OUT}$ would follow the course outlined for waveform B. The result is that many nanoseconds would have to elapse before meaningful and correct data were obtained at the output of the amplifier. This problem is obviated by placing network 60 in parallel with N2 and causing a positive shift in the output level. At the termination of precharge, N21 is turned-off. This disconnects N21 and N22 formerly connected in parallel with N2. Consequently, the impedance between node 32 and 36 is made greater relative to the impedance between node 32 and 34. The change in relative impedance values causes the output of the inverter to move closer to the transition point. Again, this is done without disturbing the level at the input of the inverter. An examination of the curve for $V_{OUT}$ resulting from a previous "1" indicates that $V_{OUT}$ is also shifted up. This, in fact, drives $V_{OUT}$ resulting from a previous "1" away from the transition point. However, note that the imbalance between the read-out time for the worst case read "1" and for the worst case read "0" has been significantly reduced. Thus the sense amplifier output is adjusted to be centered about $V_{TR}$ for the worst case conditions.

The worst case condition existing in the circuit may be determined by analysis. The result of the analysis dictates whether the sense amplifier takes the form of the circuit of FIG. 2 or that of FIG. 4.

What is claimed is:

1. A sense amplifier comprising:
   means for supplying recurring precharge pulses;
   an inverter having a signal input terminal, a signal output terminal, and first and second power terminals for receiving an operating potential therebetween, said inverter exhibiting a voltage transition point having a value between first and second voltage levels which represent first and second logic conditions, said output signal terminal of said inverter being driven toward said first or said second voltage levels dependent on whether a particular voltage being applied to its signal input terminal is above or below said voltage transition point;
   said inverter including means coupled between said signal output terminal and one of said first and second power terminals responsive to each precharge pulse for shifting the voltage level at the output of said inverter at the termination of said precharge pulse;
   selectively enabled feedback means responsive to each precharge pulse for completing a feedback connection from the output signal terminal of said inverter to its input signal terminal only for the duration of each precharge pulse;
   selectively enabled bias means responsive to each precharge pulse for applying an offset current for a predetermined period of time, independent of the precharge period, to the signal input terminal of said inverter in a sense such that the voltage at the input signal terminal of said inverter is driven to a value offset from said particular voltage in a sense to predispose the output signal terminal of said inverter to assume said first voltage level at the conclusion of each precharge pulse; and
   means for selectively applying signals to be sensed to the input signal terminal of said inverter, at selected times, each of which times follows the inception of a precharge pulse.

2. A sense amplifier at set forth in claim 1 wherein said inverter includes a first insulated-gate field-effect transistor (IGFET) of first conductivity type and second, third and fourth IGFETs of second conductivity type,
   wherein the conduction path of said first IGFET is connected between said signal output terminal and said first power terminal;
   wherein the conduction path of said second IGFET is connected between said signal output terminal and said second power terminal;
   wherein the conduction paths of said third and fourth IGFETs are connected in series between said signal output terminal and said second power terminal;
   wherein the gate electrodes of said first, second, and third IGFETs are connected to said signal input terminal; and
   wherein the gate electrode of said fourth IGFET is coupled to said means for supplying precharge pulses for turning on said fourth IGFET when a precharge pulse is present and for turning off said fourth IGFET in the absence of a precharge pulse.

3. A sense amplifier as set forth in claim 2 wherein said first conductivity type is N and said second conductivity type is P.

4. A sense amplifier as set forth in claim 2 wherein said first conductivity type is P and said second conductivity type is N.

5. The combination as claimed in claim 1 wherein said selectively enabled bias means includes a bias circuit, and pulse stretching means having an input responsive to the presence of said precharge pulses and having an output coupled to the input of said bias circuit, said bias circuit having an output connected to said signal input terminal.

6. In combination with a memory cell characterized in that a relatively large current can flow between the cell and an associated bit line for the cell storing one binary condition and little, if any, current can flow between the cell and its bit line for the cell storing the other binary condition, a sense amplifier comprising:
   amplifying means having an input and an output, and having first and second terminals for the application therebetween of an operating potential, and exhibiting a transition point between first and second logic conditions at its output responsive to a particular voltage being applied to its input;
   means connecting the input of said amplifying means to said bit line;
   selectively enabled feedback means for completing, when enabled, a feedback connection between said output and said input of said amplifying means;
   a selectively enabled biasing means for applying, when enabled, an offset current to said input of said amplifying means;
   means connected to said feedback means for precharging the input of said amplifier to a voltage approximately equal to said particular voltage during a precharge period;
   means connected to said biasing means for precharging the input of said amplifier during and beyond said precharge period, to a voltage offset from said particular voltage for predisposing the output of said amplifier to exhibit said first logic condition; and means coupled between the output of said amplifying means and at least one of said first and second terminals for shifting the output level at the termination of said precharge period.

7. A sense amplifier comprising:
means for supplying recurring precharge pulses;
an inverter having a signal input terminal, a signal output terminal, and first and second power terminals for receiving an operating potential therebetween and exhibiting a transition point having a value between first and second voltage levels which represent first and second logic conditions at its output signal terminal in response to a particular voltage being applied to its input signal;
selectively enabled feedback means responsive to each precharge pulse for completing a feedback connection from the output signal terminal of said inverter to its input signal terminal only for the duration of each precharge pulse; and
controllable impedance means coupled between said signal output terminal and one of said first and second power terminals responsive to the presence of a precharge pulse, said controllable impedance means assuming one value of impedance during the presence of a precharge pulse and assuming a second value of impedance at the termination of a precharge pulse for shifting the voltage level at the output of said inverter at the termination of a precharge pulse.

8. A sense amplifier as set forth in claim 7 wherein said controllable impedance includes first and second insulated-gate field effect transistors (IGFETs) having their conduction paths connected in series between said signal output terminal and said one of said first and second power terminals wherein their control electrode of said first IGFET is connected to said signal input terminal, and wherein the control electrode of said second IGFET is connected to said source of precharge pulses for turning on said second IGFET during a precharge period.

9. A sense amplifier comprising:
means for supplying recurring precharge pulses;
an inverter having a signal input terminal, a signal output terminal, and first and second power terminals for receiving an operating potential therebetween and exhibiting a transition point having a value between first and second voltage levels which represent first and second logic conditions as its output signal terminal in response to a particular voltage being applied to its input signal;
selectively enabled feedback means responsive to each precharge pulse for completing a feedback connection from the output signal terminal of said inverter to its input signal terminal only for the duration of each precharge pulse;
selectively enabled bias means responsive to each precharge pulse for applying a bias offset to the signal input terminal of said inverter of such polarity that the voltage at the input signal terminal of said inverter is driven to a value offset from said particular voltage for predisposing the output signal terminal of said inverter to exhibit said first logic condition at the conclusion of each precharge pulse; and
controllable impedance means coupled between said signal output terminal and one of said first and second power terminals responsive to the presence of a precharge pulse, said controllable impedance means assuming one value of impedance during the presence of a precharge pulse and assuming a second value of impedance at the termination of a precharge pulse for shifting the voltage level at the output of said inverter in a direction opposite to the direction to which the output would be driven by said bias offset at the termination of a precharge pulse.

* * * * *